United States Patent [19]

Yoneda et al.

[11] Patent Number: 5,399,804
[45] Date of Patent: Mar. 21, 1995

[54] SEMICONDUCTOR DEVICE AND METHOD OF PRODUCING THE SAME

[75] Inventors: Yoshiyuki Yoneda; Kazuto Tsuji; Junichi Kasai; Hideharu Sakoda, all of Kawasaki, Japan

[73] Assignee: Fujitsu Limited, Kanagawa, Japan

[21] Appl. No.: 37

[22] Filed: Jan. 4, 1993

[30] Foreign Application Priority Data

Jan. 8, 1992 [JP] Japan .................. 4-001560

[51] Int. Cl.6 .............................. H01L 23/02
[52] U.S. Cl. .................. 174/52.4; 257/687; 257/700; 257/787; 264/272.11
[58] Field of Search ............. 174/52.1, 52.2, 52.4; 257/671, 686, 687, 688, 700, 787, 789; 29/855, 841; 264/272.11

[56] References Cited

U.S. PATENT DOCUMENTS

| | | | |
|---|---|---|---|
| 4,714,952 | 12/1987 | Takekawa | 357/75 |
| 5,216,280 | 6/1993 | Tanaka et al. | 257/734 |
| 5,218,230 | 6/1993 | Tamamura et al. | 257/691 |
| 5,223,739 | 6/1993 | Katsumata et al. | 257/676 |
| 5,225,709 | 7/1993 | Nishiuma et al. | 257/700 |

FOREIGN PATENT DOCUMENTS

3-94457  4/1991  Japan .................. 257/666

Primary Examiner—Leo P. Picard
Assistant Examiner—Christopher Horgan
Attorney, Agent, or Firm—Nikaido, Marmelstein, Murray & Oram

[57] ABSTRACT

A semiconductor device includes a stage, a semiconductor chip which is mounted on the stage, a plurality of electrode members which are wire bonded to the semiconductor chip, where a first gap is formed between the stage and one electrode member and a second gap is formed between two electrode members, a plurality of leads including inner leads which are wire bonded to at least one of the semiconductor chip and the electrode members and electrically connected thereto, and a resin package which encapsulates the semiconductor chip, the stage, the electrode members and the inner leads by a resin. The resin fills the first and second gaps, so that the stage and the one electrode member are isolated and the two electrode members are isolated.

15 Claims, 10 Drawing Sheets

SEMICONDUCTOR DEVICE AND METHOD OF PRODUCING THE SAME

FIELD OF THE INVENTION

The present invention generally relates to semiconductor devices and methods of producing the same, and more particularly to a semiconductor device having the so-called multi-level lead frame structure and a method of producing such a semiconductor device.

BACKGROUND OF THE INVENTION

Recently, there are demands to reduce the inductance of signal pins of the semiconductor device in order to reduce simultaneous switching and power source bouncing generated at power source electrodes of the semiconductor device.

A ceramic package has been proposed to reduce the inductance of the signal pins. According to the ceramic package, leads are formed in a plurality of levels within a substrate so as to shorten the distance from a semiconductor chip to the signal electrodes, and the wiring layout is optimized. However, although the inductance of the signal pins can be reduced by the ceramic package, there is a problem in that the ceramic package is expensive compared to plastic packages.

Accordingly, a semiconductor device having a multi-level lead frame structure within the plastic package has been proposed. According to the multi-level lead frame structure, a lead frame having the leads, a lead frame having a stage on which the semiconductor chip is mounted, and a lead frame having the power source or ground electrodes are stacked, so as to increase the area of the power source or ground electrodes and enable reduction of the inductance of the signal pins.

Figure 1:
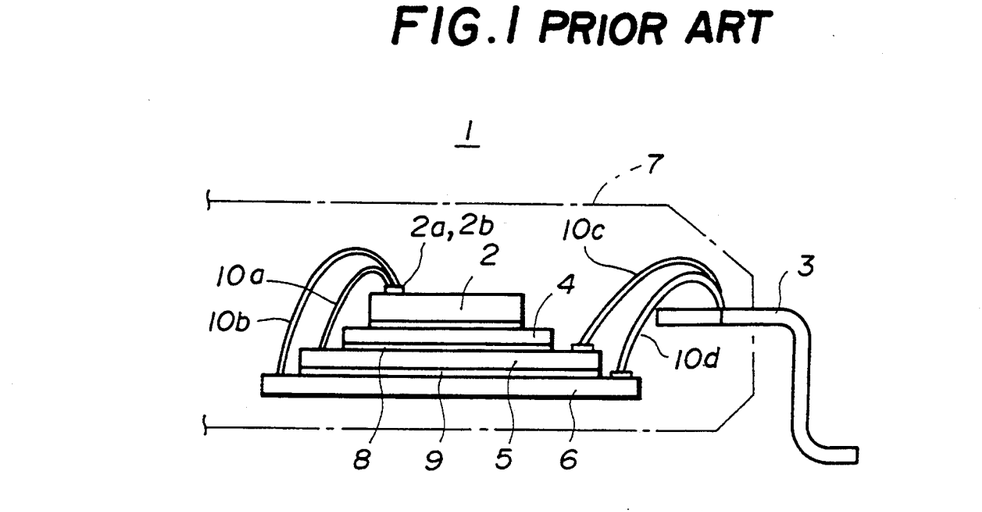
FIG. 1 is a cross sectional view showing an example of a conventional semiconductor device having a multi-level lead frame structure.
Figure 2:
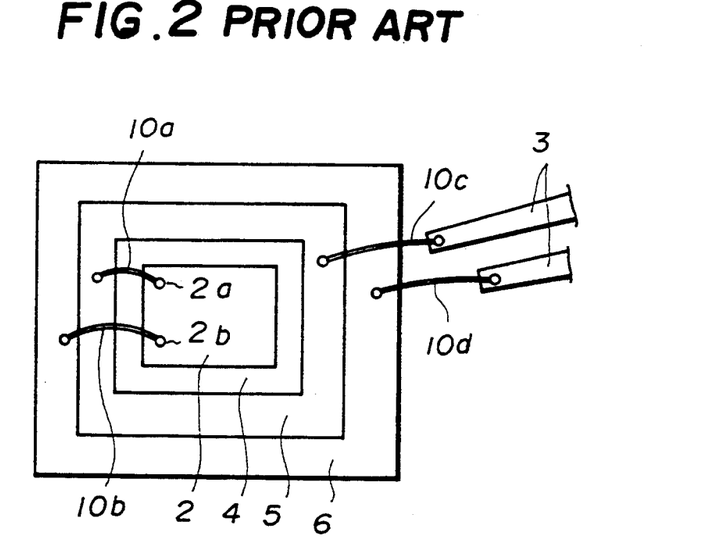
FIG. 2 is a plan view showing the conventional semiconductor device shown in FIG. 1.

Next, a description will be given of an example of a conventional semiconductor device having the multi-level lead frame structure, by referring to FIGS. 1 through 3. FIGS. 1 and 2 respectively show a cross section and a plan view of the semiconductor device, and FIG. 3 is a diagram for explaining the areas of parts forming the semiconductor device.

In FIG. 1, a semiconductor device 1 having the multi-level lead frame structure includes a semiconductor chip 2, leads 3, a stage 4, a first electrode member 5, a second electrode member 6, and a resin package 7 which is indicated by a one-dot chain line.

The semiconductor chip 2 is mounted on the stage 4. The first electrode member 5 is adhered on the lower part of the stage 4 via an adhesive tape 8. In addition, the second electrode member 6 is adhered on the lower part of the first electrode 5 via an adhesive tape 9. For example, the adhesive tapes 8 and 9 are made of polyimide.

Figure 3:
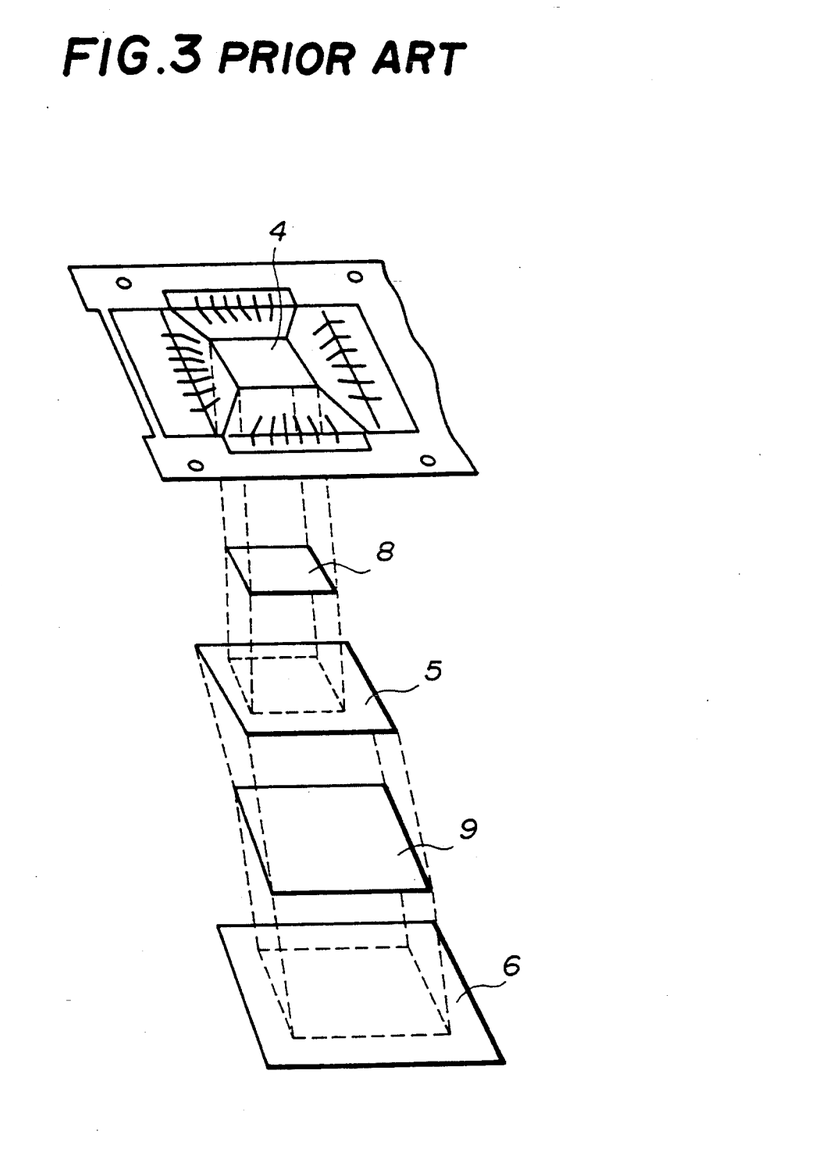
FIG. 3 is a diagram for explaining the areas of parts forming the conventional semiconductor device shown in FIG. 1.

On the other hand, as shown in FIG. 3, the area of the first electrode member 5 is larger than that of the stage 4, and the area of the second electrode 6 is larger than that of the first electrode member 5. The shape of the adhesive tape 8 is approximately the same as that of the stage 4, and the shape of the adhesive tape 9 is approximately the same as that of the first electrode member 5.

Accordingly, in the assembled state, the stage 4, the first electrode member 5 and the second electrode member 6 form a pyramid like stacked structure as shown in FIGS. 1 and 2. If it is assumed for the sake of convenience that the first electrode member 5 is used as a power source electrode and the second electrode member 6 is used as a ground electrode, a power source pad 2a of the semiconductor chip 2 and the first electrode member 5 are connected by a Au wire 10a, and a ground pad 2b of the semiconductor chip 2 and the second electrode member 6 are connected by a Au wire 10b. The leads 3 and the electrode members 5 and 6 are respectively connected by Au wires 10c and 10d.

Therefore, the inductances of the signal pins can be reduced in the semiconductor device 1 because the lengths of the wires 10a through 10d which have relatively large inductances can be made short and the areas of the electrode members 5 and 6 can be made relatively large. In other words, the inductances between the pads 2a and 2b of the semiconductor chip 2 to the leads 3 can be reduced.

However, the stage 4 and the first electrode member 5 are connected via the adhesive tape 8, and the first electrode member 5 and the second electrode member 6 are connected via the adhesive tape 9. For this reason, the adhesive agent on the adhesive tapes 8 and 9 is decomposed when heated.

The production process of the semiconductor device 1 includes a heating process in which the temperature rises to a relatively high temperature. During such a heating process, an out gas is generated from the adhesive tape 9 and contaminates the electrode members 5 and 6. As a result, the adherence between the resin which forms the resin package 7 and the electrode members 5 and 6 becomes poor, and the wire bonding to the electrode members 5 and 6 becomes difficult and poor. In addition, if the effects of the out gas reaches the leads 3, the adherence between the resin and the leads becomes poor, and the wire bonding to the leads 3 becomes difficult and poor. The reliability of the semiconductor device 1 greatly deteriorates if the adherence becomes poor and the wire bonding becomes difficult and poor.

Furthermore, the adhesive tape 9 is expensive in general. Hence, when the adhesive tape 9 is used in the multi-level lead frame structure, the semiconductor device 1 becomes expensive.

Problems similar to the above are also generated due to the provision of the adhesive tape 8.

SUMMARY OF THE INVENTION

Accordingly, it is a general object of the present invention to provide a novel and useful semiconductor device and a method of producing the same, in which the problems described above are eliminated.

Another and more specific object of the present invention is to provide a semiconductor device comprising a stage, a semiconductor chip which is mounted on the stage, a plurality of electrode members which are wire bonded to the semiconductor chip, a first gap being formed between the stage and one electrode member, a second gap being formed between two electrode members, a plurality of leads including inner leads which are wire bonded to at least one of the semiconductor chip and the electrode members and electrically connected thereto, and a resin package which encapsulates the semiconductor chip, the stage, the electrode members and the inner leads by a resin, where the resin fills the first and second gaps, so that the stage and the one electrode member are isolated and the two electrode members are isolated. According to the semiconductor device of the present invention, it is possible to satisfactorily isolate the stage and the electrode members within the resin package without the use of a resin tape or the like, and the generation of the out gas during a heating process is prevented. As a result, the adherence of the resin package with respect to the stage, the electrode members and the leads is improved, thereby making it possible to improve the reliability of the semiconductor device. The cost of the semiconductor device is also reduced because it is unnecessary to use an expensive resin tape for the isolation.

Still another object of the present invention is to provide a method of producing a semiconductor device comprising the steps of (a) forming a lead frame assembly which includes a plurality of lead frames which are spaced apart from one another and stacked, the lead frames including a first lead frame having leads formed thereon, a second lead frame arranged below the first lead frame and having a stage on which a semiconductor chip is mounted, and third lead frames arranged below the second lead frame and having electrode members, (b) connecting wires between the semiconductor chip and the first lead frame, between the semiconductor chip and the third lead frames, and between the third lead frames and the first lead frame by a wire bonding, (c) forming a resin package which encapsulates the semiconductor chip, the stage, the electrode members and inner leads of the leads, and (d) cutting off unwanted parts of the lead frame assembly located outside the resin package. According to the method of the present invention, it is possible to reduce the cost of the semiconductor device because it is unnecessary to use an expensive resin tape or the like for isolating the stage and the electrode members, and the generation of the out gas is prevented.

Other objects and further features of the present invention will be apparent from the following detailed description when read in conjunction with the accompanying drawings.

DESCRIPTION OF THE PREFERRED EMBODIMENTS

Figure 4:
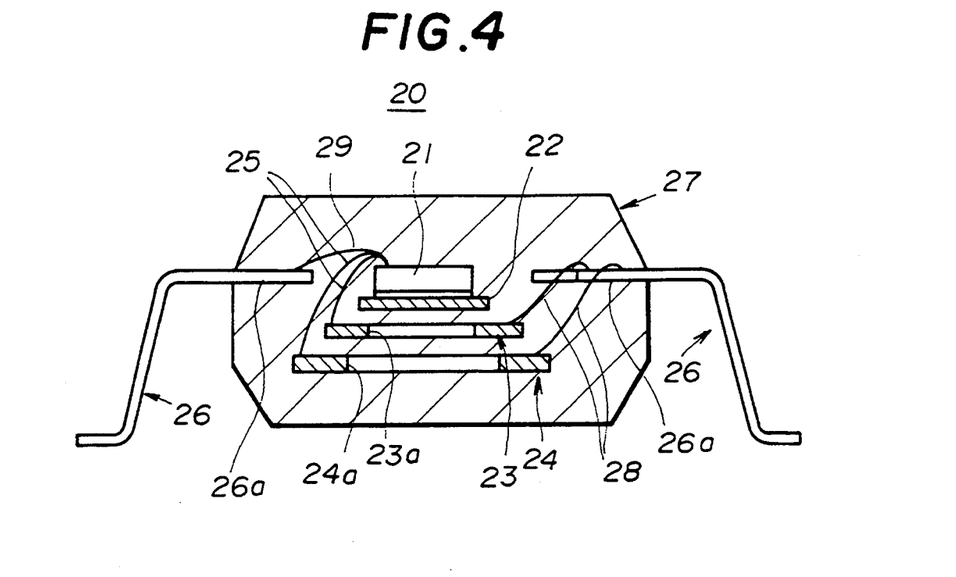
FIG. 4 is a cross sectional view showing a first embodiment of a semiconductor device according to the present invention.

A description will be given of a first embodiment of a semiconductor device according to the present invention, by referring to FIG. 4. FIG. 4 shows a cross section of a semiconductor device 20.

A semiconductor chip 21 has electrode pads (not shown) for power source, ground and signals provided on a top surface thereof. This semiconductor chip 21 is die bonded on a stage 22 and fixed thereto.

A power source electrode member 23 and a ground electrode member 24 are respectively made of rectangular plate shaped conductive metals. A rectangular hole 23a is formed at a central part of the power source electrode member 23, and a rectangular hole 24a is formed at a central part of the ground electrode member 24. In this embodiment the rectangular hole 24a is greater than the rectangular hole 23a. Au wires 25 are provided between the power source pad of the semiconductor chip 21 and the power source electrode member 23, and between the ground pad of the semiconductor chip 21 and the ground electrode member 24. Hence, the electrode members 23 and 24 are electrically connected to the semiconductor chip 21.

In this embodiment, leads 26 have a gull-wing shape, but the shape of the leads 26 is of course not limited to such. The number of leads 26 provided corresponds to the number of electrode pads formed on the semiconductor chip 21. A resin package 27 encapsulates the semiconductor chip 21, the electrode members 23 and 24, and inner lead portions 26a of the leads 26.

Au wires 28 are provided between the leads 26 and the electrode members 23 and 24. Hence, the power source pad of the semiconductor chip 21 is electrically coupled to the lead 26 via the Au wire 25, the power source electrode member 23 and the Au wire 28. In addition, the ground pad of the semiconductor chip 21 is electrically coupled to the lead 26 via the Au wire 25, the ground electrode member 24 and the Au wire 28. The signal pads of the semiconductor chip 21 are wire bonded directly on the leads 26.

The Au wires 25, 28 and 29 are wire bonded to the electrode members 23 and 24 and the leads 26, and for this reason, the surfaces of the electrode members 23 and 24 and the leads 26 are plated to enable the wire bonding. For example, Ag, Au, Pd or the like is plated, but the Pd plating is the most preferable because the Pd plating can also be used for the plating of the portions of the leads 26 extending outside the resin package 27.

The electrode members 23 and 24 are provided in the wiring paths between the semiconductor chip 21 and the leads 26, so as to reduce the inductances of the wirings from the pads to the leads 26 by providing the electrode member 23 having the large area in the wiring path from the power source pad of the semiconductor chip 21 to the lead 26 and the electrode member 24 having the large area in the wiring path from the ground pad of the semiconductor chip 21 to the lead 26. Hence, it is possible to prevent switching and bouncing from occurring in the power source and ground wirings.

On the other hand, by using the Au wires 25, 28 and 29 and the electrode members 23 and 24 in the wiring paths from the semiconductor chip 21 to the leads 26, it is possible to use the resin package 27 which is an inexpensive package. As a result, it is also possible to reduce the cost of the semiconductor device 20.

In the resin package 27, a predetermined gap is formed between the stage 22 and the power source electrode member 23 and a predetermined gap is formed between the power source electrode member 23 and the ground electrode member 24. The resin which forms the resin package 27 fills these predetermined gaps. In other words, the stage 22 and the electrode members 23 and 24 are held within the resin package 27 in a stage where the stage 22 and the power source electrode member 23 are isolated by the resin and the power source electrode member 23 and the ground electrode member 24 are isolated by the resin.

Therefore, according to the semiconductor device 20, it is unnecessary to provide the adhesive tapes 8 and 9 shown in FIG. 1 which were conventionally required to isolate the stage 4 and the electrode members 5 and 6 within the resin package 7. For this reason, no out gas is generated during the production process of the semiconductor device 20 or during the mounting process of the semiconductor device 20. Consequently, the adherence of the stage 22, the electrode members 23 and 24 and the leads 26 to the resin package 27 is improved, thereby making it possible to improve the reliability of the semiconductor device 20 compared to the conventional semiconductor device 1.

Next, a description will be given of an embodiment of a method of producing the semiconductor device 20.

First, a lead frame assembly 30 is made. This lead frame assembly 30 is made up of first and second lead frames 31 and 32, a lead frame 33 for power source electrode, a lead frame 34 for ground electrode, and spacer lead frames 35 through 37. In other words, the lead frame assembly 30 is made up of 7 lead frames.

Figure 5:
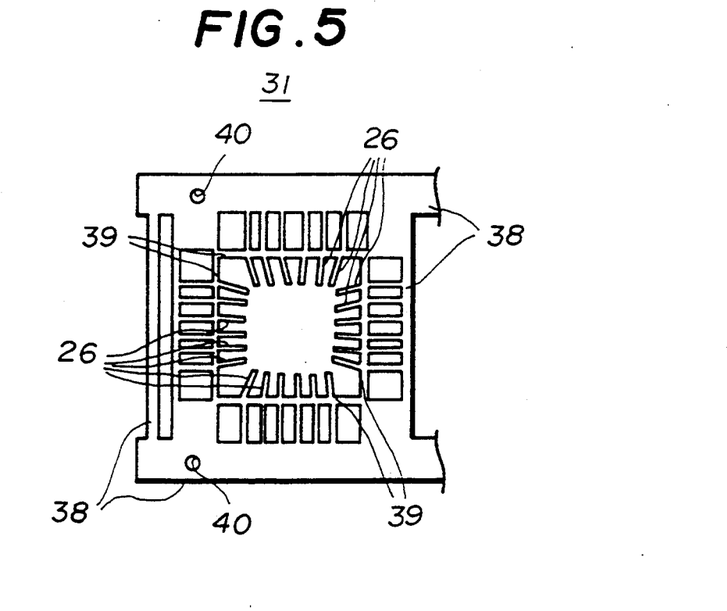
FIG. 5 is a plan view showing a first lead frame.

FIG. 5 shows the first lead frame 31. The first lead frame 31 includes the leads 26 which extend inwardly of an outer frame 38, and each lead 26 is fixed to a predetermined position by a tie bar 39. The first lead frame 31 is formed to the shape shown in FIG. 5 by a press, and is thereafter subjected to a plating process to enable the wire bonding. For example, a Pd plating is made on the entire surface of the lead frame 31. In addition, positioning holes 40 are formed at predetermined positions in the outer frame 39.

Figure 6:
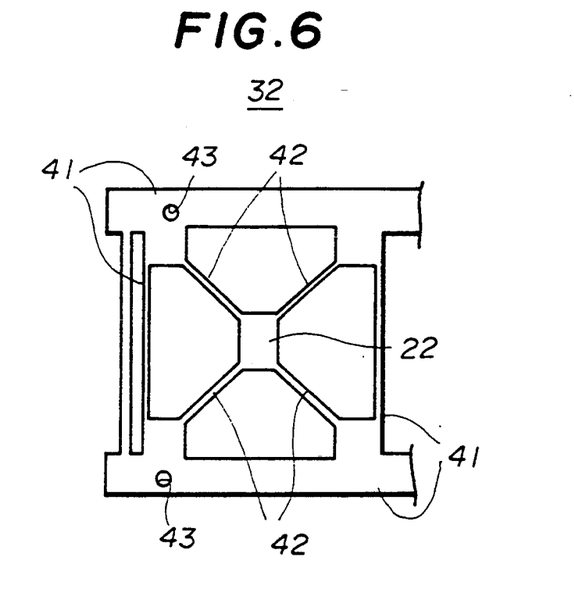
FIG. 6 is a plan view showing a second lead frame.

FIG. 6 shows the second lead frame 32. The second lead frame 32 includes the stage 22 which is supported on an external frame 41 by four support bars 42 which extend diagonally from the four corners. In addition, positioning holes 43 are formed at predetermined positions in the outer frame 41.

Figure 7:
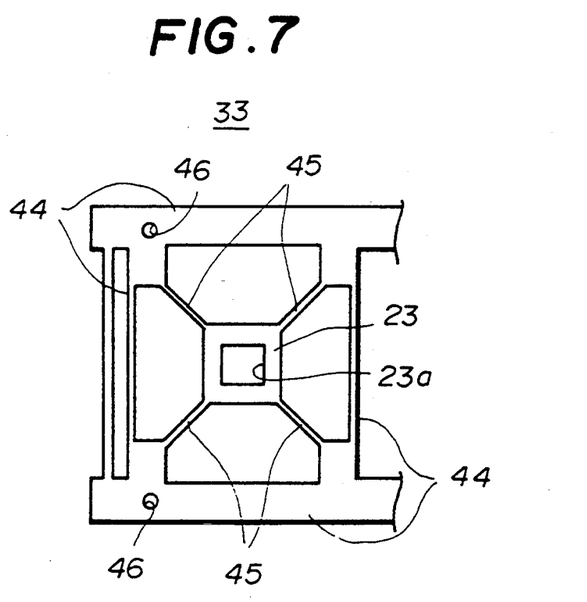
FIG. 7 is a plan view showing a lead frame for power source electrode.

FIG. 7 shows the lead frame 33 for power source electrode. The lead frame 33 includes the power source electrode member 23 which is supported on an external frame 44 by four support bars 45 which extend diagonally from the four corners. In addition, a rectangular hole 23a is formed at a central part of the power source electrode member 23. The lead frame 33 is formed into the shape shown in FIG. 7 by a press, and is thereafter subjected to a plating process to enable the wire bonding. For example, a Pd plating is made on the entire surface of the lead frame 33. In addition, positioning holes 46 are formed at predetermined positions in the outer frame 44. The area of the power source electrode member 23 is set greater than the area of the stage 22 if the rectangular hole 23a is disregarded. In other words, the outer contour of the power source electrode member 23 is greater than that of the stage 22.

Figure 8:
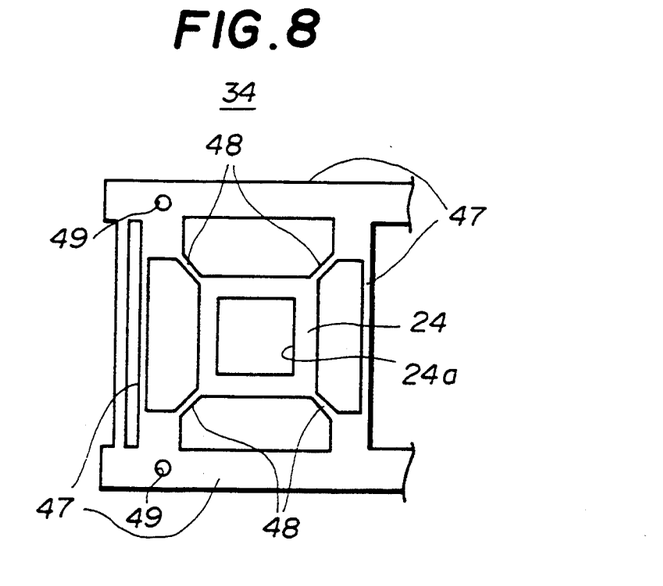
FIG. 8 is a plan view showing a lead frame for ground electrode.

FIG. 8 shows the lead frame 34 for ground electrode. The lead frame 34 includes the ground electrode member 24 which is supported on an external frame 47 by four support bars 48 which extend diagonally from the four corners. In addition, a rectangular hole 24a is formed at a central part of the ground electrode member 24. The lead frame 34 is formed into the shape shown in FIG. 8 by a press, and is thereafter subjected to a plating process to enable the wire bonding. For example, a Pd plating is made on the entire surface of the lead frame 34. In addition, positioning holes 49 are formed at predetermined positions in the outer frame 47. The area of the ground electrode member 24 is set greater than the area of the power source electrode member 23, if the rectangular holes 23a and 24a are disregarded. In other words, the outer contour of the ground electrode member 24 is greater than that of the power source electrode 23.

Figure 9:
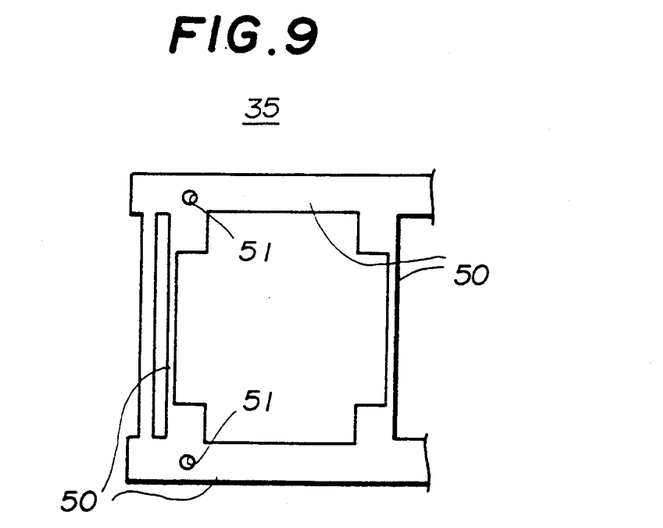
FIG. 9 is a plan view showing a spacer lead frame.

FIG. 9 shows the spacer lead frame 35. The illustration of the spacer lead frames 36 and 37 will be omitted because the spacer lead frames 35 through 37 have identical constructions, and a description will be given only with respect to the spacer lead frame 35. The spacer lead frame 35 consists solely of an outer frame 50, and the inside of the outer frame 50 is open. Positioning holes 51 are formed at predetermined positions in the outer frame 50.

Figure 10:
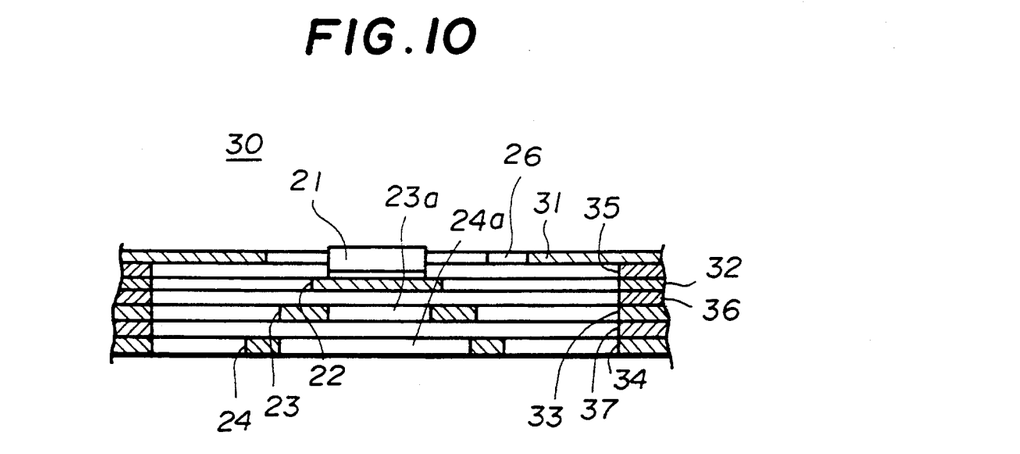
FIG. 10 is a cross sectional view showing a lead frame assembly.

The lead frame assembly 30 is formed by stacking the lead frames 31 through 37 described above. FIG. 10 shows this lead frame assembly 30. FIG. 10 shows a state where the semiconductor chip 21 is already mounted on the stage 22 of the second lead frame 32.

As shown in FIG. 10, the lead frame assembly 30 includes the lead frames 31, 35, 32, 36, 33, 37 and 34 from the top to bottom in this sequence. The lead frames 31 through 37 may be connected by a laser welding, rivets or the like. In this embodiment, the lead frames 31 through 37 are connected by the laser welding. In addition, the lead frames 31 through 37 are aligned relative to one another by matching the positioning holes 40, 43, 46, 49 and 51.

By connecting the lead frames 31 through 37 to form the lead frame assembly 30, a gap corresponding to the thickness of the spacer lead frame 36 is formed between the stage 22 and the power source electrode member 23, and a gap corresponding to the thickness of the spacer lead frame 37 is formed between the power source electrode member 23 and the ground electrode member 24.

Figure 11:
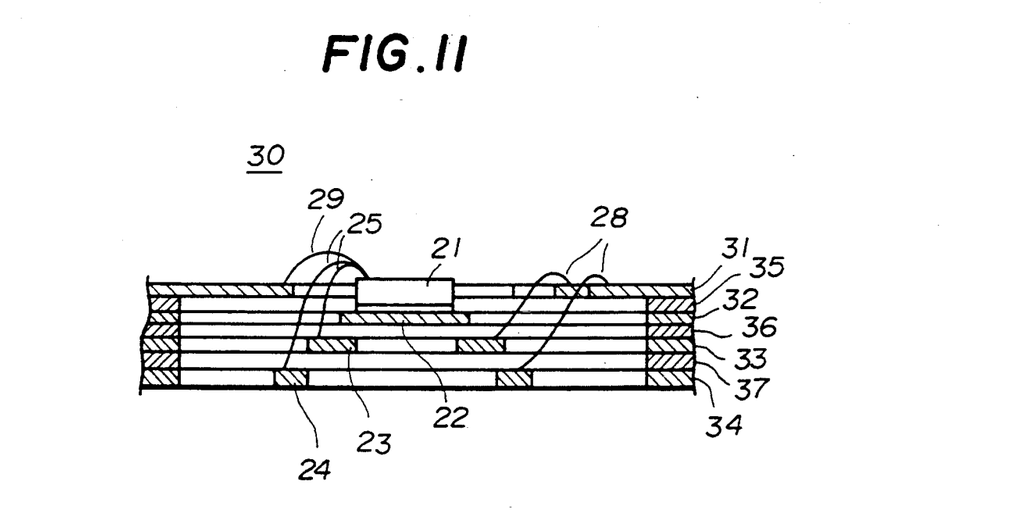
FIG. 11 is a cross sectional view showing the lead frame assembly after wire bonding.

After forming the lead frame assembly 30 by the lead frame forming process, a wire bonding process is carried out as shown in FIG. 11. The Au wires 25 are provided between the power source pad of the semiconductor chip 21 and the power source electrode member 23 and between the ground pad of the semiconductor chip 21 and the ground electrode member 24 by a wire bonding. In addition, the Au wires 28 are provided between the leads 26 and the electrode members 23 and 24 by a wire bonding. Furthermore, the Au wires 29 are provided between the signal pads of the semiconductor chip 21 and the leads 26 by a wire bonding.

Figure 12:
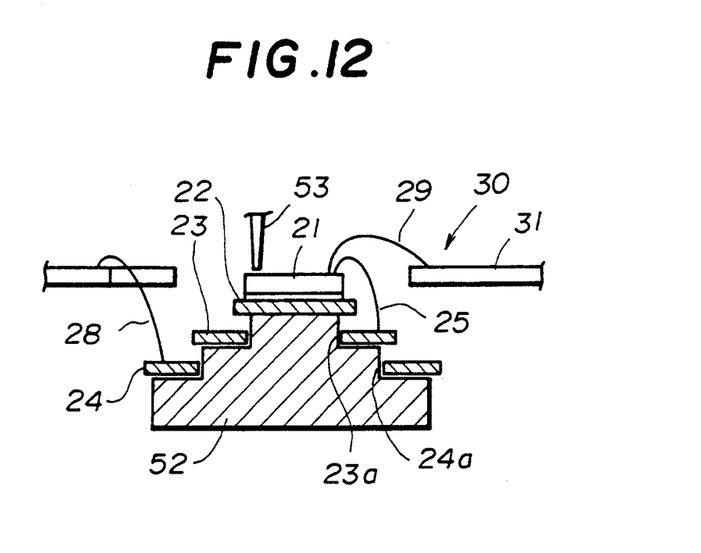
FIG. 12 is a cross sectional view showing a jig used for the wire bonding.

A jig 52 shown in FIG. 12 may be used during the wire bonding process described above. This jig 52 has stepped parts for receiving the lead frame assembly 30, and the lead frame assembly 30 is stably held on the jig 52 by the provision of the rectangular holes 23a and 24a in the electrode members 23 and 24. A capillary 53 positively makes an ultrasonic bonding, thereby making it possible to carry out a highly reliable wire bonding process.

Figure 13:
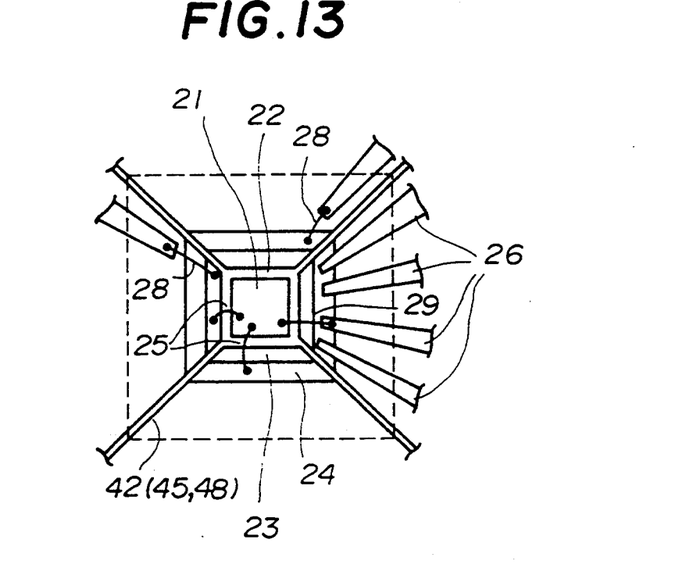
FIG. 13 is a plan view showing the lead frame assembly after the wire bonding.

FIG. 13 shows a plan view of the lead frame assembly 30 after the wire bonding process. As described above, the area of the power source electrode member 23 is greater than that of the stage 22, and the area of the ground electrode member 24 is greater than that of the power source electrode member 23. Accordingly, the stage 22 and the electrode members 23 and 24 are arranged in a pyramid like shape such that the cross sectional area increases from the top to bottom. For this reason, the above described differences in the areas can be used to form bonding areas, thereby making it possible to arbitrarily select the bonding position.

Furthermore, a satisfactory wire bonding can be made because the surfaces of the lead frames 33 and 34 are Pd plated. This Pd plating also ensures a positive wire bonding.

After the wire bonding process ends, a molding process is carried out. In the molding process, the lead frame assembly 30 is fit into dies, and the resin package 27 is formed by injecting the resin into the dies. The lead frame assembly 30 is heated when making the resin encapsulation during this molding process. However, since the lead frame assembly 30 does not include a resin adhesive tape or the like which would cause generation of the out gas, no out gas is generated.

Accordingly, the lead frames 31 through 37 are protected and prevented from contamination by the out gas, and the adherence of the lead frames 31 through 37 with respect to the resin package 27 is improved compared to the conventional semiconductor device 1, and the reliability of the semiconductor device 20 is improved.

Figure 14:
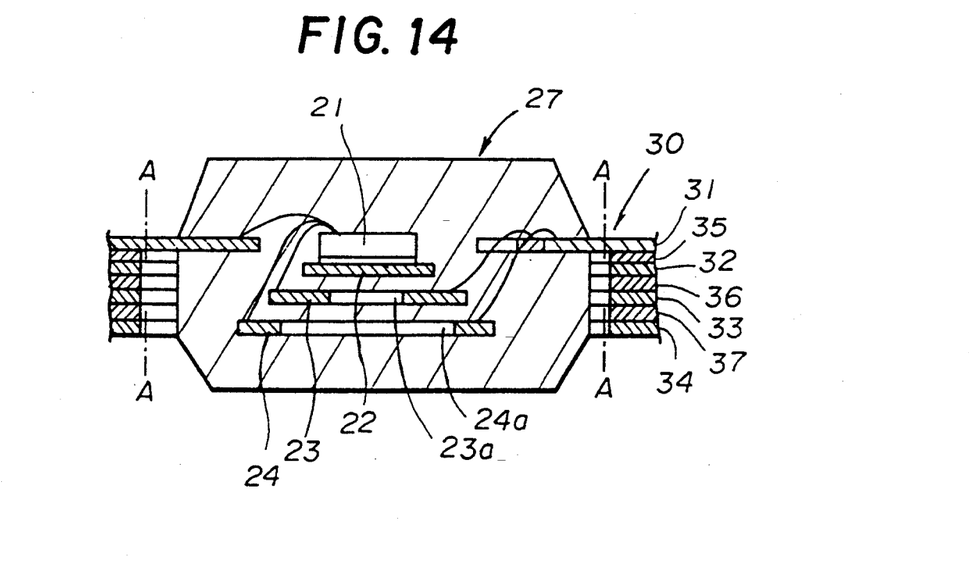
FIG. 14 is a cross sectional view showing the lead frame assembly after resin encapsulation.

FIG. 14 shows the resin package 27 which encapsulates the lead frame assembly 30. By the formation of this resin package 27, the gape between the stage 22 and the power source electrode member 23 and the gap between the power source electrode member 23 and the ground electrode member 24 are filled by the resin. Hence, the stage 22, the power source electrode member 23 and the ground electrode member 24 are mutually isolated and fixed by the resin within the resin package 27. In addition, the above described gaps are maintained by the resin which wills these gaps. Of course, the leads 31 through 37 are connected outside the resin package 27 because the outer frames 38, 41, 47 and 50 are connected on the outside of the resin package 27.

Since the rectangular holes 23a and 24a are formed at the central parts of the respective electrode members 23 and 24, the resin can easily fill the above described gaps via these rectangular holes 23a and 24a during the molding process. For this reason, the resin can positively fill the gaps even if the gaps are relatively narrow, and a satisfactory resin encapsulation can be made without generating a void.

On the other hand, because the electrode members 23 and 24 are simply supported by the respective support bars 42 and 48, the flow of the resin may move the positions of the electrode members 23 and 24 when the resin is injected. If the electrode members 23 and 24 move a relatively long distance, the electrode members 23 and 24 will make contact and the semiconductor device 20 will not operate correctly.

Next, a description will be given of methods of preventing the movement of the electrode members 23 and 24 during the molding process, by referring to FIG. 15.

Figure 15A:
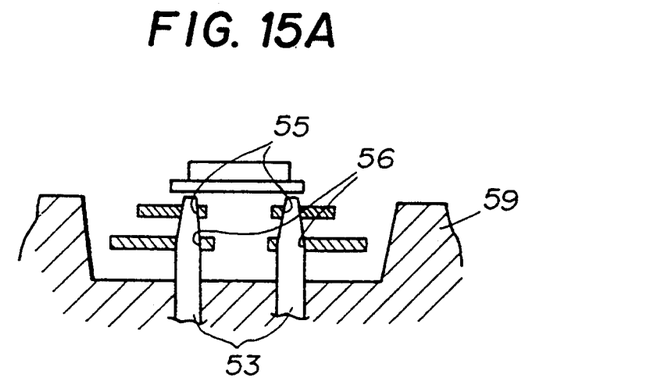
FIGS. 15(A)–15(B) and 16 respectively show cross sectional views for explaining a structure for preventing the electrode members from moving during resin molding.

In FIG. 15 (A), engaging holes 55 are formed in the power source electrode member 23 of the lead frame 33, and engaging holes 56 are formed in the ground electrode member 24 of the lead frame 34. Eject pins 53 have tapered tip ends, and the diameter of the engaging holes 55 is set smaller than that of the engaging holes 56. Hence, when the eject pins 53 engage the engaging holes 55 and 56, the electrode members 23 and 24 are positioned at predetermined positions within a die 59.

Figure 15B:
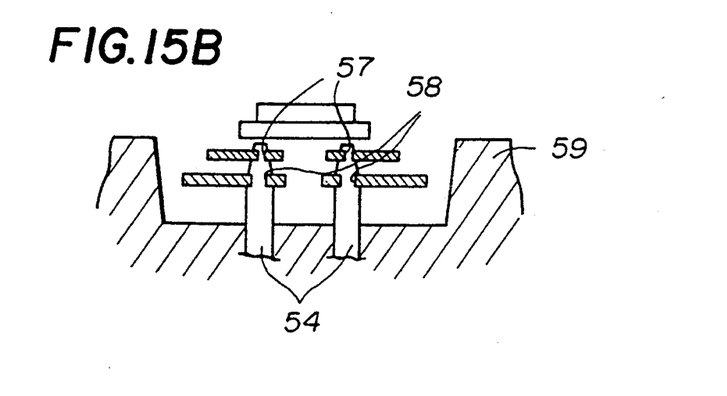

On the other hand, in FIG. 15 (B), engaging holes 57 are formed in the power source electrode member 23 of the lead frame 33, and engaging holes 58 are formed in the ground electrode member 24 of the lead frame 34. Eject pins 54 have stepped tip ends, and the diameter of the engaging holes 57 is set smaller than that of the engaging holes 58. Hence, when the eject pins 54 engage the engaging holes 57 and 58, the electrode members 23 and 24 are positioned at predetermined positions within the die 59.

Figure 16:
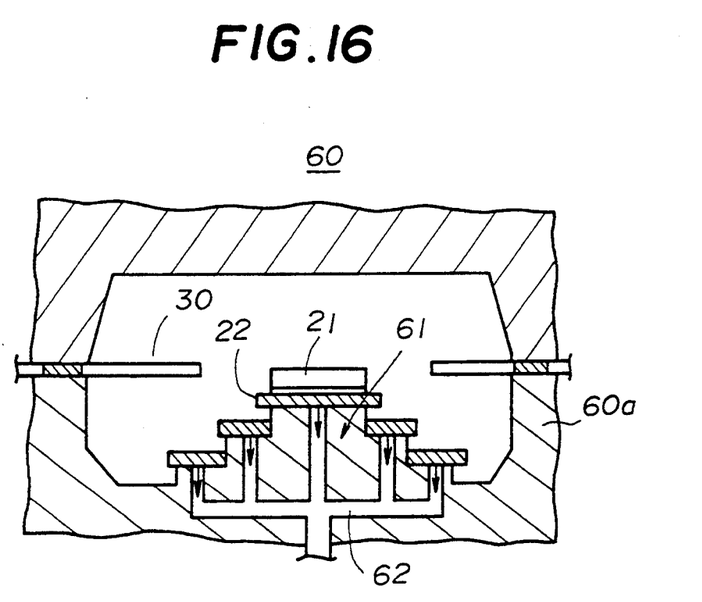

Furthermore, a die 60 may be constructed as shown in FIG. 16. In this case, a loading base 61 having stepped parts for receiving the lead frame assembly 30 is formed in a lower die 60a. A vacuum pipe arrangement 62 is connected to the stepped parts of the loading base 61 where the stage 22 and the electrode members 23 and 24 rest, so as to position these elements by vacuum. In other words, the lead frame assembly 30 which is loaded on the loading base 61 is positioned under vacuum via the vacuum pipe arrangement 62, and the movement of the stage 22 and the electrode members 23 and 24 is restricted. For this reason, the stage 22 and the electrode members 23 and 24 are positively prevented from moving and making contact with one another even when the resin is injected into the die 60 during the molding process.

Figure 17:
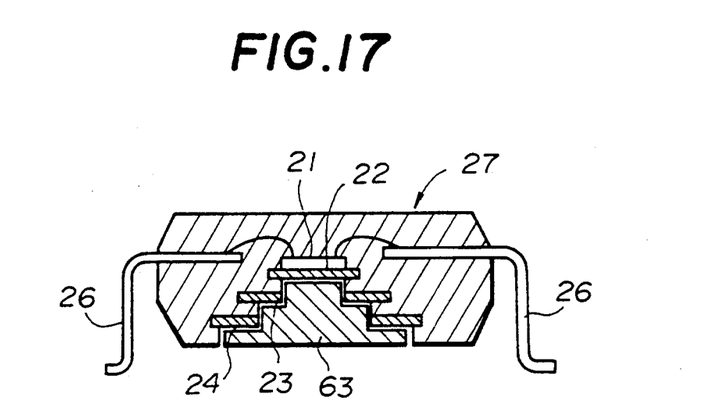
FIG. 17 is a cross sectional view showing a second embodiment of the semiconductor device according to the present invention.

In the case of the die 60 shown in FIG. 16, the resin is not filled at the part corresponding to the position where the loading base 61 is provided. However, it is possible to encapsulate this part by providing a radiator member 63 as shown FIG. 17 or by filling the resin into this part. FIG. 17 shows a second embodiment of the semiconductor device according to the present invention. In FIG. 17, those parts which are the same as those corresponding parts in FIG. 4 are designated by the same reference numerals, and a description thereof will be omitted.

Figure 18:
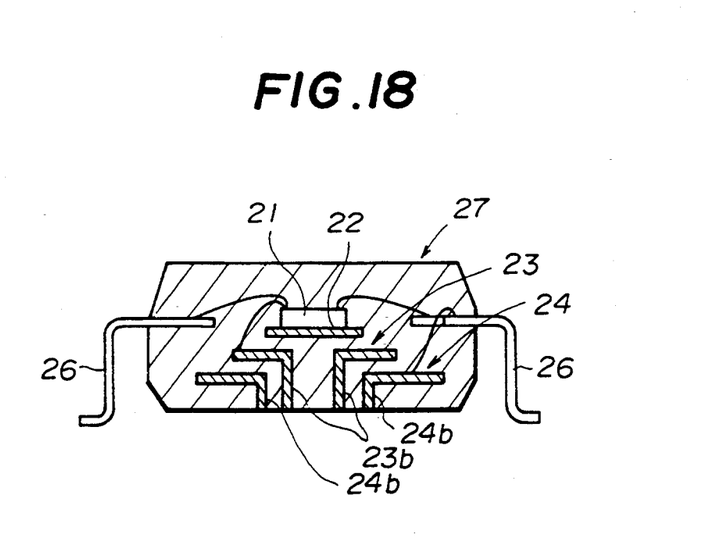
FIG. 18 is a cross sectional view showing a third embodiment of the semiconductor device according to the present invention having a structure for preventing the electrode members from moving during resin molding.

As another method of preventing the stage 22 and the electrode members 23 and 24 from moving during the molding process, it is possible to form bent parts 23a on the electrode member 23 and bent parts 24a on the electrode member 24a as shown in FIG. 18. In this case, the bent parts 23a and 24b make contact with the bottom surface of the die when injecting the resin, so as to support the electrode members 23 and 24 during the molding process. FIG. 18 shows a third embodiment of the semiconductor device according to the present invention. In FIG. 18, those parts which are the same as those corresponding parts in FIG. 4 are designated by the same reference numerals, and a description thereof will be omitted.

Generally, a tie bar is provided on the lead frame in order to prevent the resin from leaking from the die. Accordingly, when encapsulating the lead frame assembly 30 which is made up of the lead frames 31 through 37, it is conceivable to form the die bar on each of the lead frames 31 through 37. But in this embodiment, the tie bar 39 is provided on only the first lead frame 31, and no tie bar is provided on the remaining lead frames 32 through 37. For this reason, it is necessary to prevent the resin from leaking from the die at the support bars 42, 45 and 48 of the lead frames 32, 33 and 34.

Figure 19:
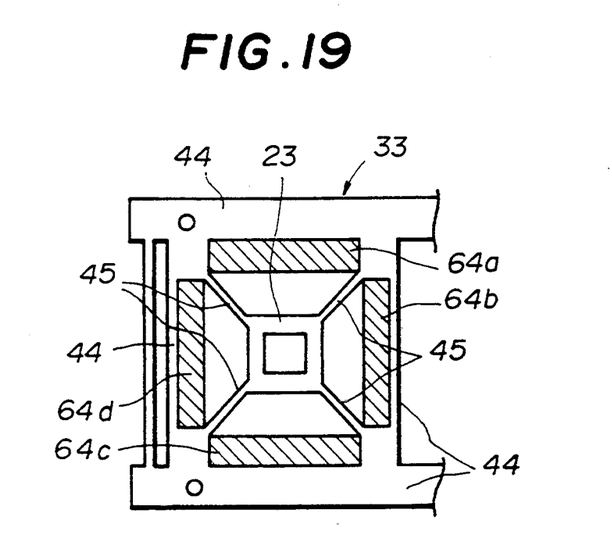
FIG. 19 is a plan view showing a die structure used in a molding process.

In FIG. 19, which shows the lead frame 33 as an example, the die is made up of divided dies 64a through 64d. The divided dies 64a through 64d are positioned on the inside of the external frame 44 of the lead frame 33, and the support bars 45 are put between the divided dies 64a through 64d. Hence, the resin leak from the die can be prevented without providing the tie bar on the lead frame 33. As a result, it is possible to simplify the troublesome process of cutting the tie bar by reducing the locations where the tie bar is provided, and accordingly, improve the production efficiency. It is possible to use divided dies similar to the divided dies 64a through 64d for each of the lead frames 32 and 34.

When the molding process described above ends, the lead frame assembly 30 is cut at positions indicated by a line A—A in FIG. 14, so as to cut off the unwanted external frame parts of the lead frames 31 through 37. Thereafter, the leads 26 are formed into a predetermined shape, and the semiconductor device 20 shown in FIG. 4 which is inexpensive and highly reliable is completed.

In the described embodiments, the lead frame assembly 30 is made up of a total of 7 lead frames 31 through 37. However, the number of lead frames forming the lead frame assembly 30 is of course not limited to 7.

In the described embodiments, the spacer lead frames 36 and 37 which have constructions different from those of the lead frames 32 through 34 are used to provide the gap between the stage 22 and the power source electrode member 23 and the gape between the power source electrode member 23 and the ground electrode member 24. However, it is possible to provide projections, pins, bosses or the like on the external frame of selected ones or ones of the lead frames 32, 33 and 34 to provide the above described gaps. In addition, the number of parts required may be reduced by providing the projections, pins, bosses or the like on the external frame of the selected lead frame or frames.

Further, the present invention is not limited to these embodiments, but various variations and modifications may be made without departing from the scope of the present invention.

What is claimed is:

1. A semiconductor device comprising:
   a stage;
   a semiconductor chip which is mounted on the stage;
   a plurality of electrode members which are wire bonded to the semiconductor chip, a first gap being formed between the stage and a first electrode member, a second gap being formed between said first electrode member and a second electrode member;
   a plurality of leads including inner leads which are wire bonded to at least one of the semiconductor chip and the electrode members and electrically connected thereto; and
   a resin package which encapsulates the semiconductor chip, the stage, the electrode members and the inner leads by a resin,
   said resin filling said first and second gaps, so that the stage and said first electrode member are isolated and said first and second electrode members are isolated.

2. The semiconductor device as claimed in claim 1, wherein said electrode members have plated surfaces for enabling wire bonding.

3. The semiconductor device as claimed in claim 1, wherein at least the inner leads have plated surfaces for enabling wire bonding.

4. The semiconductor device as claimed in claim 3, wherein the plated surfaces are made of a material selected from a group consisting of Pd, Ag and Au.

5. The semiconductor device as claimed in claim 1, wherein said leads have plated surfaces in their entirety, including surfaces of the inner leads.

6. The semiconductor device as claimed in claim 5, wherein the plated surfaces are made of a material selected from a group consisting of Pd, Ag and Au.

7. The semiconductor device as claimed in claim 1, wherein said stage has an area different from those of said electrode members.

8. The semiconductor device as claimed in claim 7, wherein said stage has an outer contour smaller than that of said first electrode member.

9. The semiconductor device as claimed in claim 8, wherein:
   said electrode members at least include said first electrode member and said second electrode member which is located above the first electrode member,
   said stage is located above the second electrode member,
   the outer contour of the first electrode member is larger than that of the second electrode member, and
   the outer contour of the second electrode member is larger than that of the stage.

10. The semiconductor device as claimed in claim 1, wherein at least one of said electrode members includes a hole which is filled by the resin.

11. The semiconductor device as claimed in claim 10, wherein:
   said electrode members at least include the first electrode member having a first hole and the second electrode member which is located above the first electrode member and having a second hole,
   said stage is located above the second electrode member,
   an outer contour the first electrode member is larger than that of the second electrode member, and
   an outer contour of the second electrode member is larger than that of the stage.

12. The semiconductor device as claimed in claim 11, wherein the first hole of the first electrode member is greater than the second hole of the second electrode member.

13. The semiconductor device as claimed in claim 1, wherein each of said electrode members include parts which are exposed at the same surface of said resin package.

14. The semiconductor device as claimed in claim 1, wherein at least two of said electrode members include a first hole and second holes which are smaller than the first hole, said first and second holes are filled by the resin, and said second holes are used for positioning the electrode members during a production stage of the semiconductor device.

15. A semiconductor device comprising:
   a stage;
   a semiconductor chip which is mounted on the stage;
   at least one electrode member which is wire bonded to the semiconductor chip, at least one gap being formed between the stage and the at least one electrode member;
   a plurality of leads including inner leads which are wire bonded to at least one of the semiconductor chip and the at least one electrode member and electrically connected thereto; and
   a resin package which encapsulates the semiconductor chip, the stage, the at least one electrode member and the inner leads by a resin;
   said resin filling said gap, so that the stage and said at least one electrode member are isolated.

* * * * *